US011814726B2

(12) United States Patent
Takahashi et al.

(10) Patent No.: US 11,814,726 B2
(45) Date of Patent: Nov. 14, 2023

(54) DRY ETCHING METHOD OR DRY CLEANING METHOD

(71) Applicant: KANTO DENKA KOGYO CO., LTD., Tokyo (JP)

(72) Inventors: Yoshinao Takahashi, Tokyo (JP); Katsuya Fukae, Shibukawa (JP); Korehito Kato, Shibukawa (JP)

(73) Assignee: KANTO DENKA KOGYO CO., LTD., Tokyo (JP)

( * ) Notice: Subject to any disclaimer, the term of this patent is extended or adjusted under 35 U.S.C. 154(b) by 0 days.

(21) Appl. No.: 18/145,343

(22) Filed: Dec. 22, 2022

(65) Prior Publication Data

US 2023/0131072 A1 Apr. 27, 2023

Related U.S. Application Data

(62) Division of application No. 16/497,495, filed as application No. PCT/JP2018/011990 on Mar. 26, 2018.

(30) Foreign Application Priority Data

Mar. 27, 2017 (JP) .................................. 2017-061262

(51) Int. Cl.
*C23C 16/44* (2006.01)
*B08B 5/00* (2006.01)
(Continued)

(52) U.S. Cl.
CPC ............ *C23C 16/4405* (2013.01); *B08B 5/00* (2013.01); *B08B 7/0071* (2013.01); *B08B 7/04* (2013.01); *C23C 16/24* (2013.01)

(58) Field of Classification Search
CPC ..... C23C 16/4405; B08B 7/04; B08B 7/0071; C09K 13/08; H01L 21/32135
See application file for complete search history.

(56) References Cited

U.S. PATENT DOCUMENTS 6,136,214 A 10/2000 Mori et al.
6,147,006 A 11/2000 Mouri et al.
(Continued)

FOREIGN PATENT DOCUMENTS

JP 07273088 A 10/1995
JP 10242130 A 9/1998
(Continued)

OTHER PUBLICATIONS

Oehrlein et al., "Atomic Layer Etching at the Tipping Point: An Overview", ECS Journal of Solid State Science and Technology, pp. N5041-N5053, vol. 4, No. 6 (Mar. 2015).
(Continued)

*Primary Examiner* — Binh X Tran
(74) *Attorney, Agent, or Firm* — BROWDY AND NEIMARK, PLLC

(57) ABSTRACT

Provided are a method of selectively etching a film primarily containing Si, such as polycrystalline silicon (Poly-Si), single crystal silicon (single crystal Si), or amorphous silicon (a-Si) as well as a method for cleaning by removing a Si-based deposited and/or attached matter inside a sample chamber of a film forming apparatus, such as a chemical vapor deposition (CVD) apparatus, without damaging the apparatus interior.

By simultaneously introducing a monofluoro interhalogen gas (XF, where X is any of Cl, Br, and I) and nitric oxide (NO) into an etching or a film forming apparatus, followed by thermal excitation, it is possible to selectively and rapidly etch a Si-based film, such as Poly-Si, single crystal Si, or a-Si, while decreasing the etching rate of SiN and/or $SiO_2$. It is also possible to perform cleaning by removing a Si-based deposited and/or attached matter inside a film forming apparatus, such as a CVD apparatus, without damaging the apparatus interior.

12 Claims, 1 Drawing Sheet

(51) Int. Cl.
  B08B 7/00 (2006.01)
  B08B 7/04 (2006.01)
  C23C 16/24 (2006.01)

(56) References Cited

U.S. PATENT DOCUMENTS

| | | | |
|---|---|---|---|
| 6,368,518 B1* | 4/2002 | Vaartstra | C23F 4/00 |
| | | | 216/75 |
| 11,584,989 B2* | 2/2023 | Takahashi | B08B 5/00 |
| 2004/0069610 A1* | 4/2004 | Arno | B08B 7/0035 |
| | | | 422/186.3 |
| 2005/0019977 A1 | 1/2005 | Prakash | |
| 2011/0259370 A1 | 10/2011 | Kameda et al. | |
| 2014/0248783 A1 | 9/2014 | Kameda et al. | |
| 2014/0357085 A1 | 12/2014 | Moriya et al. | |
| 2016/0303620 A1 | 10/2016 | Kim et al. | |
| 2018/0301334 A1 | 10/2018 | Dhamrin | |
| 2019/0140061 A1 | 5/2019 | Chu-Kung | |

FOREIGN PATENT DOCUMENTS

| | | |
|---|---|---|
| JP | 2000265276 A | 9/2000 |
| JP | 2014170786 A | 9/2014 |
| JP | 2014236055 A | 12/2014 |
| JP | 5888674 B2 | 3/2016 |
| JP | 2016219786 A | 12/2016 |
| JP | 2017059824 A | 3/2017 |
| KR | 20110118564 A | 10/2011 |

OTHER PUBLICATIONS

International Search Report for PCT/JP2018/011990 dated May 15, 2018.

Extended European Search Report issued for the corresponding European patent application of EP18777970.7 dated Nov. 27, 2020.

Ling et al., Influence of nano-scale dopants of Pt, CaO and SiO2, on the alcohol sensing of SnO2 thin films, Sensors and Actuators B 119:497-503 (2006).

Machida et al., The effect of SiO2 addition in super-hydrophilic property of TiO2 photocatalyst, Journal of Materials Science, 2569-2574 (1999).

Thomas Muller et al. "CO2 Chemistry", Beilstein Journal of Organic Chemistry, pp. 675-677, via https://www.ncbi.nlm.nih.gov/pmc/articles/PMC4464315/pdf/Beilstein_J_Org_Chem-11-675.pdf; (Year: 2015).

* cited by examiner

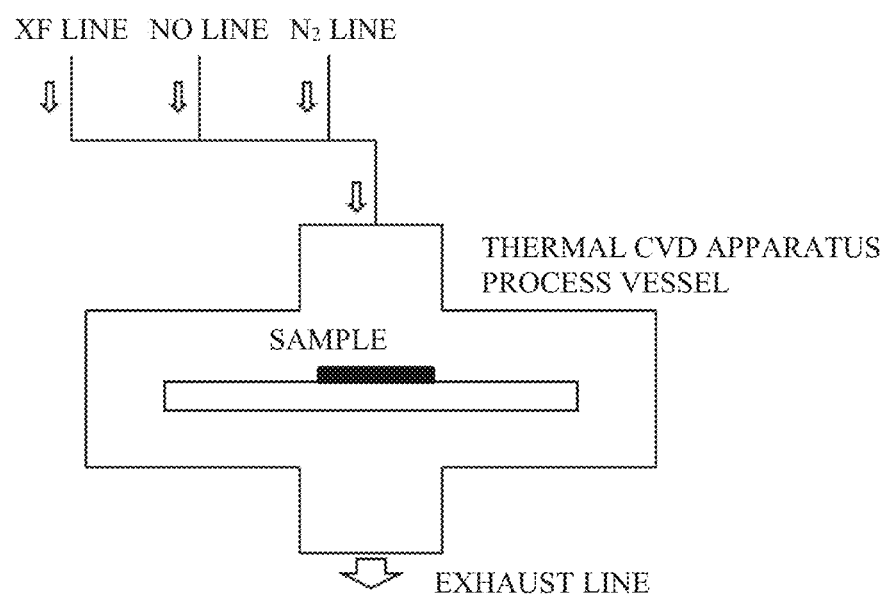

DRY ETCHING METHOD OR DRY CLEANING METHOD

TECHNICAL FIELD

The present invention relates to a method of performing dry etching or dry cleaning by utilizing a chemical reaction induced by simultaneous use of a monofluoro interhalogen gas and nitric oxide. Specifically, the present invention relates to a method of selectively processing a film primarily containing Si or selectively removing a deposit primarily containing Si.

BACKGROUND ART

In the leading-edge semiconductor dry etching, processing is performed in several nm or less scale. For such miniaturization, it is extremely important to selectively process a Si-containing film relative to other films by dry etching using a highly reactive gas or plasma. For example, polycrystalline silicon (Poly-Si) is used as a hard mask in dry etching, and the unnecessary Poly-Si hard mask has to be removed after etching. In such an occasion, dry etching for selectively etching Poly-Si alone without etching the underlying film is required.

Meanwhile, dry cleaning is performed to remove unwanted deposits generated through film formation and attached to the inner surface of a film forming apparatus (plasma chemical vapor deposition (CVD) apparatus, thermal CVD apparatus, or sputtering apparatus, for example) used for semiconductor fabrication, liquid crystal panel manufacture, and the like. Dry cleaning is thus a necessary step to prevent contamination of products due to, for example, attachment of particles generated from detached deposits and to keep the apparatus inner surface clean. To increase the throughput, dry cleaning is typically performed by using a highly reactive gas at high speed. However, such dry cleaning causes corrosion of and/or damage to the apparatus interior due to high reactivity.

When selectivity is enhanced in dry etching or when corrosion of and/or damage to the apparatus is desired to be decreased in dry cleaning, a gas having reactivity lower than typically used gases is often employed. In such a case, however, it is more likely to slow the etching rate or to increase the cleaning time, thereby decreasing the throughput for product manufacture. Accordingly, an ideal gas system exhibits high reactivity to a target substance to be processed or removed but low reactivity to other substances and thus can perform etching or cleaning more selectively or with less damage.

To resolve the above-described problems, Patent Literature (PTL) 1 discloses a method of supplying $F_2$ and NO to a chamber to generate FNO and F atoms and selectively dry etching Si or Poly-Si relative to a $SiO_2$ mask by using the F atoms at a relatively low temperature of 25° C. or lower without using plasma.

The method disclosed in PTL 1 is characterized in that plasma that damages a device by UV light, ions, and/or electrons is not employed by utilizing instead a chemical reaction ($F_2+NO \rightarrow F+FNO$) similar to the present invention and that an apparatus interior or a substrate to be processed is less susceptible to unwanted damage since the process temperature is low. In PTL 1, however, there are concerns, for example, that extremely highly reactive and hazardous $F_2$ is used and that a complex control mechanism is needed in a process that requires precise control, such as etching, since the reaction between $F_2$ and NO is an exothermic reaction.

Actually, heat as well as F atoms and FNO that are generated by the reaction between $F_2$ and NO damage the interior of a film forming apparatus. In view of this, PTL 2 discloses a method of introducing, into a film forming apparatus, a reaction gas whose exothermic energy of the reaction has been removed. The method disclosed in PTL 2 can decrease damage to the interior of a film forming apparatus. To adopt this method, however, it is needed to newly install a mechanism for removing the exothermic energy of the reaction between $F_2$ and NO as well as a system for controlling the mechanism. Accordingly, introducing this method into an existing film forming apparatus and the like is considered to be difficult in some cases.

In the prior inventions, it is possible to etch Si and/or SiN, or to perform cleaning, by using highly reactive F atoms generated by the reaction between $F_2$ and NO. However, since the reactivity of F atoms is high, when SiN is selectively etched relative to Si, for example, it is needed to precisely control temperature conditions within a narrow range as disclosed in PTL 3.

CITATION LIST

Patent Literature

PTL 1: Japanese Patent No. 5888674
PTL 2: Japanese Unexamined Patent Application Publication No. 2014-170786
PTL 3: Japanese Unexamined Patent Application Publication No. 2014-236055

Non Patent Literature

NPL 1: ECS Journal of Solid State Science and Technology, 4 (6) N5041-N5053 (2015)

SUMMARY OF INVENTION

Technical Problem

The inventions disclosed in PTL 1, PTL 2, and PTL 3 enable low-temperature high-speed etching of Si, or cleaning, by the reaction between $F_2$ and NO. Accordingly, these inventions are extremely effective for shortening the process time and/or effective in a process unsuitable for high-temperature conditions. In addition, since reactive F atoms can be generated in the absence of plasma, plasma-derived UV light, ions, and/or electrons are not generated without applying unwanted energy to a substrate or an apparatus. Accordingly, reactions preferentially occur with a substance that readily reacts with F atoms. Consequently, selective etching or cleaning becomes possible without damaging a substrate or an apparatus.

Meanwhile, the prior inventions use extremely highly reactive $F_2$. The operation of a process that uses such a highly reactive gas involve a considerable risk. In addition, pipes and/or an apparatus interior may be corroded by heat generated from the reaction between $F_2$ and NO. Accordingly, it is required, for example, to control heat generation by the reaction or to introduce a mechanism for removing the exothermic energy. As described above, when etching or cleaning using $F_2$ and NO is actually performed, safety measures for facilities and/or capital investment for improved equipment and the like are needed.

Moreover, F atoms generated by the reaction between $F_2$ and NO exhibit high reactivity to Si, but also react with other Si-containing films, such as SiN and $SiO_2$. Accordingly, accurate temperature control is indispensable to selectively etch Si alone, or to perform cleaning.

The present invention intends to resolve the problems in conventional etching or cleaning that uses $F_2$ and NO by employing a monofluoro interhalogen gas represented by XF (X is any halogen element of Cl, Br, and I) and nitric oxide (NO). The present invention thus provides a method of selectively etching a film primarily containing Si or a method for cleaning by removing an attached matter or a deposited matter primarily containing Si without damaging the apparatus interior.

Solution to Problem

As a result of vigorous investigation to achieve the above-mentioned object, the present inventors found that mixing a monofluoro interhalogen gas represented by XF with NO in an appropriate ratio and using the mixture under heated conditions is effective for performing, by a further simple method, selective dry etching of a Si-based film, deposited matter, attached matter, and the like, or performing dry cleaning, without corroding or damaging the interior of an etching or film forming apparatus for these Si-based materials, thereby accomplishing the present invention.

According to the present invention, the following embodiments are provided.

[1] A dry etching method including: simultaneously introducing a monofluoro interhalogen gas represented by XF (X is any halogen element of Cl, Br, and I) and nitric oxide (NO) into a reaction chamber of an etching apparatus; and thermally inducing a reaction of an object to be etched with XF and NO.

[2] A dry etching method including: mixing a monofluoro interhalogen gas represented by XF (X is any halogen element of Cl, Br, and I) with nitric oxide (NO), followed by heating to induce a chemical reaction between XF and NO; and supplying a generated excited species to the inside of an etching apparatus.

[3] A dry cleaning method including: simultaneously introducing a monofluoro interhalogen gas represented by XF (X is any halogen element of Cl, Br, and I) and nitric oxide (NO) into a reaction chamber of a film forming apparatus; and thermally inducing a reaction, with XF and NO, of an object to be removed for cleaning.

[4] A dry cleaning method including: mixing a monofluoro interhalogen gas represented by XF (X is any halogen element of Cl, Br, and I) with nitric oxide (NO), followed by heating to induce a chemical reaction between XF and NO; and supplying a generated excited species to the inside of a film forming apparatus.

[5] The dry etching method according to [1] or [2] or the dry cleaning method according to [3] or [4], where when a mixing ratio of the monofluoro interhalogen gas represented by XF (X is any halogen element of Cl, Br, and I) to nitric oxide (NO) is expressed in a volume ratio or a flow rate ratio as XF:NO=1:Y, Y satisfies 0<Y<2.

[6] The dry etching method according to [1] or [2] or the dry cleaning method according to [3] or [4], where a monofluoro halogen gas is ClF.

[7] The dry etching method according to [1], where during dry etching, a temperature inside the reaction chamber of the etching apparatus or a temperature of the object to be etched is 20° C. to 700° C.

[8] The dry cleaning method according to [3], where during dry cleaning, a temperature inside the film forming apparatus or a temperature of a wall surface of a reaction device is 20° C. to 700° C.

[9] The dry etching method according to [2] or the dry cleaning method according to [4], where a heating temperature for a mixture of the monofluoro interhalogen gas represented by XF (X is any halogen element of Cl, Br, and I) and nitric oxide (NO) is 20° C. to 700° C.

[10] The dry etching method according to [1], where by adjusting the inside of the reaction chamber of the etching apparatus or the object to be etched to 20° C. to 700° C., a film whose 90% or more of a constituent element is any of Si, Ge, Al, W, Ti, and Hf or a film whose 90% or more of constituent elements are two or more elements of Si, Ge, Al, W, Ti, and Hf is selectively etched relative to each oxide and/or nitride of Si, Ge, Al, W, Ti, and Hf.

[11] The dry cleaning method according to [3], where by adjusting a temperature inside the film forming apparatus or a temperature of an inner wall of the film forming apparatus to 20° C. to 700° C., an attached matter and/or a deposited matter whose 70% or more of a constituent element is any of Si, Ge, Al, W, Ti, and Hf or an attached matter and/or a deposited matter whose 70% or more of constituent elements are two or more elements of Si, Ge, Al, W, Ti, and Hf are removed, or cleaning is performed, without deterioration or corrosion of a constituent material of the apparatus.

[12] The dry etching method according to [2] or the dry cleaning method according to [4], where a chemical reaction of the following equation 1 is induced by a heating temperature of 20° C. to 700° C. for a mixture of the monofluoro interhalogen gas represented by XF (X is any halogen element of Cl, Br, and I) and nitric oxide (NO), $$XF+NO \rightarrow X+FNO \quad (1)$$

and generated X atoms (X is any halogen element of Cl, Br, and I) and nitrosyl fluoride (FNO) are supplied.

[13] The dry etching method according to [1] or [2] or the dry cleaning method according to [3] or [4], where by diluting XF (X is any halogen element of Cl, Br, and I) and nitric oxide (NO) with at least one low-reactivity gas selected from the group consisting of $N_2$, Ar, He, Kr, Xe, and $CO_2$, an etching rate and/or etching selectivity are controlled in dry etching, or a cleaning time and/or corrosion of or damage to the interior of the film forming apparatus are decreased in dry cleaning.

Advantageous Effects of Invention

The present invention provides a dry etching method or a dry cleaning method that resolves the problems in conventional dry etching methods or dry cleaning methods and that enables etching of or removal for cleaning of a Si-based film or deposit with good selectivity and controllability without using plasma and without damaging a substrate or the interior of a film forming apparatus.

The dry etching method or dry cleaning method of the present invention exerts the following effects.

(1) The method is relatively safe since a monofluoro interhalogen gas represented by XF having reactivity lower than $F_2$ is used.

(2) The reaction between a monofluoro interhalogen gas represented by XF and nitric oxide (NO) is characterized in that the reaction progresses just by mixing as in the reaction between $F_2$ and NO but does not involve intense heat generation as in the reaction between $F_2$ and NO, and is thus easily controlled. Accordingly, the method does not need a mechanism for removing exothermic energy and is applicable to the existing state of a heating mechanism-equipped etching apparatus or film forming apparatus without adding a new mechanism.

(3) The method uses X atoms that are generated by the reaction between a monofluoro interhalogen gas represented by XF and nitric oxide (NO) and that do not react with SiN or $SiO_2$ even at a high temperature. Accordingly, it is possible to selectively etch or remove for cleaning a Si-based film or deposit alone.

(4) Relative to $SiO_2$, SiN, or metal material oxides and/or nitrides, it is also possible to selectively etch or remove for cleaning: a metal material other than Si, such as Al or Hf, that forms an extremely high boiling point compound by the reaction with F atoms and is thus unsusceptible to etching or removal for cleaning; as well as a material, such as W, Ti, a metal material, SiGe, or WSi, that forms a highly volatile compound by the reaction with X atoms.

(5) X atoms generated by the reaction between a monofluoro interhalogen gas represented by XF and nitric oxide (NO) exhibit high reaction activity and react with the materials described in (4) even at 20° C. Accordingly, it is possible to remove deposits on a difficult-to-heat portion inside an etching apparatus or a film forming apparatus.

(6) The etching method and cleaning method exhibit extremely high selectivity and thus do not cause unwanted damage to a substrate or an apparatus. Accordingly, it is possible to enhance the production yield of semiconductor devices and other devices and to extend the lifetime of manufacturing apparatuses.

(7) The etching method and cleaning method are highly controllable. Accordingly, even when a high-temperature portion is locally formed during the process, excessive reactions do not occur, thereby enabling uniform processing and decreased damage.

BRIEF DESCRIPTION OF DRAWINGS

FIG. 1 is a schematic view of a thermal CVD apparatus used in the Examples section.

DESCRIPTION OF EMBODIMENTS

The monofluoro interhalogen gas represented by XF used in the dry etching method or the dry cleaning method of the present invention has a purity of desirably 80 vol % or more and particularly preferably 90 vol % or more.

When a mixing ratio of the monofluoro interhalogen gas represented by XF to nitric oxide (NO) is expressed in a volume ratio or a flow rate ratio as XF: NO=1:Y, Y preferably satisfies the range of 0<Y<2. Further, the range of $0.5 < Y \le 1$ is particularly preferable since the following reaction progresses efficiently.

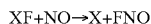

XF+NO→X+FNO

When the ratio of NO is high, the concentration of X atoms is diluted or XNO, which is not quite active in reactions, is generated, thereby lowering etching and cleaning efficiency.

Meanwhile, when the ratio of NO is low, excessive reactions progress due to XF, thereby making controlled reactions or selective reactions difficult.

In the present invention, by using an appropriate inert gas, such as $N_2$, He, Ar, Kr, Xe, or $CO_2$, as a diluent gas, excessive reactions are suppressed in the reaction between the monofluoro interhalogen gas represented by XF and nitric oxide (NO) as well as in the reaction between X atoms, which are generated by the reaction between XF and NO, and a film or a deposit primarily containing an element, such as Si, W, or Al, that forms a volatile compound by the reaction with X. Such use of a diluent gas is preferable to perform etching or cleaning with better controllability. The diluent gas is preferably mixed to have an XF concentration of 5 to 50 vol % and is particularly preferably mixed to have an XF concentration of 5 to 30 vol %.

In the dry etching method or the dry cleaning method of the present invention, X atoms, which are generated by the reaction between the monofluoro interhalogen gas represented by XF and nitric oxide (NO), has high reaction activity. Accordingly, reactions with a material to be etched or a material to be removed for cleaning progress even at 20° C., thereby making formation and subsequent removal of a volatile substance possible. Meanwhile, to promote formation reactions of a volatile substance and to efficiently volatilize and remove the formed product, the atmosphere within an etching apparatus or an apparatus to be cleaned, a substrate to be etched, a wall surface of an apparatus, or the like is heated to 100° C. or higher in some cases. A low reaction temperature, at which reactions are slow, is preferable when controllability is required. When a short cleaning time or etching rate is required and when the boiling point of a compound to be formed by the reaction is high, etching or cleaning is preferably performed at a temperature of 20° C. or higher and is more preferably performed at a temperature of 100° C. or higher. Meanwhile, when etching or cleaning is performed at 700° C. or higher, controlled reactions become difficult. Accordingly, etching or cleaning is performed preferably at 700° C. or lower, more preferably 400° C. or lower, and particularly preferably 300° C. or lower. At a temperature of 700° C. or lower, the method of the present invention is found to exhibit effects comparable to or higher than conventional methods that use XF, $F_2$, or $ClF_3$. In particular, the method of the present invention exhibits, at any temperature, higher performance than conventional methods that use XF and demonstrates performance comparable to or higher than methods that use a highly reactive gas, such as $F_2$ or $ClF_3$.

In the dry etching method or the dry cleaning method of the present invention, it is possible to efficiently react X atoms, which are generated by the reaction between XF and NO, with a material to be etched or a material to be removed for cleaning by introducing a monofluoro interhalogen gas represented by XF, nitric oxide (NO), and an inert gas selected from $N_2$, He, Ar, Kr, Xe, and $CO_2$ and by adjusting the pressure inside an etching apparatus or a film forming apparatus to 0.001 to 760 Torr. In particular, the pressure is preferably adjusted to 0.001 to 300 Torr since even a reaction product having a high boiling point and thus a low vapor pressure can be efficiently discharged outside the apparatus.

EXAMPLES

Hereinafter, the present invention will be described in further detail with reference to the Examples and Comparative Examples. The present invention, however, is not limited to these Examples.

The examples below were performed by using the thermal CVD apparatus illustrated in FIG. 1. In the apparatus of FIG. 1, a process vessel is provided to ensure space for CVD processing of a sample, and a pipe that can circulate fluids is connected to the process vessel. As illustrated FIG. 1, the pipe originates from an XF supply line and is joined with an NO supply line and further with an inert gas line ($N_2$ line) on the downstream side of the NO supply line. The pipe is designed to supply a mixture of XF, NO, and an inert gas to the process vessel. A mass flow controller is provided on each line, and a flow rate of a gas is adjustable for each line. Temperature adjustment is possible for the sample mount and the processing space. An exhaust line for discharging a gas after reaction is also provided in the process vessel. Other specifications of the apparatus are as follows.

Materials for the apparatus (chamber wall: quartz, pipe and other parts: SUS 306, susceptor and heating section: Ni)

Reaction chamber size (diameter: ø222 mm, height: 200 mm)

Heating mode (resistive heating)

Example 1

A Si wafer sample composed of a 100 nm $SiO_2$ film formed on a Si substrate and a 300 nm polycrystalline silicon (Poly-Si) film further formed on the $SiO_2$ film, a Si wafer sample composed of a 300 nm SiN film formed on a Si substrate, and a Si wafer sample composed of a 1,000 nm $SiO_2$ film formed on a Si substrate were placed inside the process vessels of a vacuum apparatus that can individually heat these samples. As a monofluoro halogen gas, ClF was used. ClF and NO were each supplied to the inside of each process vessel at a flow rate of 100 sccm through a mass flow controller from the respective cylinders. At the same time, $N_2$ as a diluent inert gas was supplied at a flow rate of 400 sccm. The temperature and pressure inside the apparatus were adjusted to 100° C. and 100 Torr, respectively, and the samples were processed for 30 seconds. As a result, the Poly-Si film was over-etched and the etching rate was 600.0 nm/min or more, the etching rate of the SiN film was 1.5 nm/min, and the etching rate of the $SiO_2$ film was 0.0 nm/min. The selectivity of Poly-Si relative to SiN is 400.0 or more, and the selectivity of Poly-Si relative to $SiO_2$ is infinity.

Example 2

Poly-Si, SiN, and $SiO_2$ samples same as Example 1 were employed and placed inside the process vessels of the vacuum apparatus that can individually heat these samples. As a monofluoro halogen gas, ClF was used. ClF and NO were each supplied to the inside of each process vessel at a flow rate of 100 sccm through a mass flow controller from the respective cylinders. At the same time, $N_2$ as a diluent inert gas was supplied at a flow rate of 400 sccm. The temperature and pressure inside the apparatus were adjusted to 200° C. and 100 Torr, respectively, and the samples were processed for 30 seconds. As a result, the Poly-Si film was over-etched and the etching rate was 600.0 nm/min or more, the etching rate of the SiN film was 1.7 nm/min, and the etching rate of the $SiO_2$ film was 0.0 nm/min. The selectivity of Poly-Si relative to SiN is 352.9 or more, and the selectivity of Poly-Si relative to $SiO_2$ is infinity.

Example 3

Poly-Si, SiN, and $SiO_2$ samples same as Example 1 were employed and placed inside the process vessels of the vacuum apparatus that can individually heat these samples. As a monofluoro halogen gas, ClF was used. ClF and NO were each supplied to the inside of each process vessel at a flow rate of 100 sccm through a mass flow controller from the respective cylinders. At the same time, $N_2$ as a diluent inert gas was supplied at a flow rate of 400 sccm. The temperature and pressure inside the apparatus were adjusted to 300° C. and 100 Torr, respectively, and the samples were processed for 30 seconds. As a result, the Poly-Si film was over-etched and the etching rate was 600.0 nm/min or more, the etching rate of the SiN film was 1.2 nm/min, and the etching rate of the $SiO_2$ film was 12.9 nm/min. The selectivity of Poly-Si relative to SiN is 500.0 or more, and the selectivity of Poly-Si relative to $SiO_2$ is 46.5 or more.

Example 4

Poly-Si, SiN, and $SiO_2$ samples same as Example 1 were employed and placed inside the process vessels of the vacuum apparatus that can individually heat these samples. As a monofluoro halogen gas, ClF was used. ClF and NO were each supplied to the inside of each process vessel at a flow rate of 100 sccm through a mass flow controller from the respective cylinders. At the same time, $N_2$ as a diluent inert gas was supplied at a flow rate of 400 sccm. The temperature and pressure inside the apparatus were adjusted to 400° C. and 100 Torr, respectively, and the samples were processed for 30 seconds. As a result, the Poly-Si film was over-etched and the etching rate was 600.0 nm/min or more, the etching rate of the SiN film was 24.9 nm/min, and the etching rate of the $SiO_2$ film was 0.0 nm/min. The selectivity of Poly-Si relative to SiN is 24.1 or more, and the selectivity of Poly-Si relative to $SiO_2$ is infinity.

Comparative Example 1

Poly-Si, SiN, and $SiO_2$ samples same as Example 1 were employed and placed inside the process vessels of the vacuum apparatus that can individually heat these samples. As a monofluoro halogen gas, ClF was used. ClF was supplied to the inside of each process vessel at a flow rate of 100 sccm through a mass flow controller from a cylinder. At the same time, $N_2$ as a diluent inert gas was supplied at a flow rate of 400 sccm. The temperature and pressure inside the apparatus were adjusted to 100° C. and 100 Ton, respectively, and the samples were processed for 30 seconds. As a result, the etching rate of the Poly-Si film was 2.0 nm/min, the etching rate of the SiN film was 1.2 nm/min, and the etching rate of the $SiO_2$ film was 0.0 nm/min. The selectivity of Poly-Si relative to SiN is 1.7, and the selectivity of Poly-Si relative to $SiO_2$ is infinity. Here, the etching rate of Poly-Si is 0.003 times or less the result in Example 1.

Comparative Example 2

Poly-Si, SiN, and $SiO_2$ samples same as Example 1 were employed and placed inside the process vessels of the vacuum apparatus that can individually heat these samples. As a monofluoro halogen gas, ClF was used. ClF was supplied to the inside of each process vessel at a flow rate of 100 sccm through a mass flow controller from a cylinder. At the same time, $N_2$ as a diluent inert gas was supplied at a flow rate of 400 sccm. The temperature and pressure inside the apparatus were adjusted to 200° C. and 100 Ton, respectively, and the samples were processed for 30 seconds. As a result, the etching rate of the Poly-Si film was 170.8 nm/min, the etching rate of the SiN film was 3.3 nm/min, and the etching rate of the SiO$_2$ film was 0.0 nm/min. The selectivity of Poly-Si relative to SiN is 51.8, and the selectivity of Poly-Si relative to SiO$_2$ is infinity. Here, the etching rate of Poly-Si is 0.285 times or less the result in Example 1.

Comparative Example 3

Poly-Si, SiN, and SiO$_2$ samples same as Example 1 were employed and placed inside the process vessels of the vacuum apparatus that can individually heat these samples. As a monofluoro halogen gas, ClF was used. ClF was supplied to the inside of each process vessel at a flow rate of 100 sccm through a mass flow controller from a cylinder. At the same time, N$_2$ as a diluent inert gas was supplied at a flow rate of 400 sccm. The temperature and pressure inside the apparatus were adjusted to 300° C. and 100 Torr, respectively, and the samples were processed for 30 seconds. As a result, the etching rate of the Poly-Si film was 375.4 nm/min, the etching rate of the SiN film was 12.5 nm/min, and the etching rate of the SiO$_2$ film was 4.0 nm/min. The selectivity of Poly-Si relative to SiN is 30.0, and the selectivity of Poly-Si relative to SiO$_2$ is 93.9. Here, the etching rate of Poly-Si is 0.626 times or less the result in Example 1.

Comparative Example 4

Poly-Si, SiN, and SiO$_2$ samples same as Example 1 were employed and placed inside the process vessels of the vacuum apparatus that can individually heat these samples. As a monofluoro halogen gas, ClF was used. ClF was supplied to the inside of each process vessel at a flow rate of 100 sccm through a mass flow controller from a cylinder. At the same time, N$_2$ as a diluent inert gas was supplied at a flow rate of 400 sccm. The temperature and pressure inside the apparatus were adjusted to 400° C. and 100 Torr, respectively, and the samples were processed for 30 seconds. As a result, the Poly-Si film was over-etched and the etching rate was 600.0 nm/min or more, the etching rate of the SiN film was 141.7 nm/min, and the etching rate of the SiO$_2$ film was 0.0 nm/min. The selectivity of Poly-Si relative to SiN is 4.2 or more, and the selectivity of Poly-Si relative to SiO$_2$ is infinity.

Example 5

Poly-Si, SiN, and SiO$_2$ samples same as Example 1 were employed and placed inside the process vessels of the vacuum apparatus that can individually heat these samples. As a monofluoro halogen gas, ClF was used. ClF and NO were each supplied to the inside of each process vessel at a flow rate of 100 sccm for ClF and 300 sccm for NO through a mass flow controller from the respective cylinders. At the same time, N$_2$ as a diluent inert gas was supplied at a flow rate of 400 sccm. The temperature and pressure inside the apparatus were adjusted to 200° C. and 100 Torr, respectively, and the samples were processed for 30 seconds. As a result, the etching rate of the Poly-Si film was 501.4 nm/min, the etching rate of the SiN film was 2.1 nm/min, and the etching rate of the SiO$_2$ film was 0.0 nm/min. The selectivity of Poly-Si relative to SiN is 238.8, which is lower than that in Example 2, and the selectivity of Poly-Si relative to SiO$_2$ is infinity.

Example 6

Poly-Si, SiN, and SiO$_2$ samples same as Example 1 were employed and placed inside the process vessels of the vacuum apparatus that can individually heat these samples. As a monofluoro halogen gas, ClF was used. ClF and NO were each supplied to the inside of each process vessel at a flow rate of 100 sccm for ClF and 100 sccm for NO through a mass flow controller from the respective cylinders. At the same time, N$_2$ as a diluent inert gas was supplied at a flow rate of 400 sccm. The temperature and pressure inside the apparatus were adjusted to 20° C. and 100 Torr, respectively, and the samples were processed for 30 seconds. As a result, the etching rate of the Poly-Si film was 29.4 nm/min, the etching rate of the SiN film was 0.4 nm/min, and the etching rate of the SiO$_2$ film was 0.0 nm/min. The selectivity of Poly-Si relative to SiN is 73.5, and the selectivity of Poly-Si relative to SiO$_2$ is infinity.

Comparative Example 5

Poly-Si, SiN, and SiO$_2$ samples same as Example 1 were employed and placed inside the process vessels of the vacuum apparatus that can individually heat these samples. In place of a monofluoro halogen gas, F$_2$ was used. F$_2$ and NO were each supplied to the inside of each process vessel at a flow rate of 100 sccm through a mass flow controller from the respective cylinders. At the same time, N$_2$ as a diluent inert gas was supplied at a flow rate of 400 sccm. The temperature and pressure inside the apparatus were adjusted to 200° C. and 100 Torr, respectively, and the samples were processed for 30 seconds. As a result, both the Poly-Si film and the SiN film were over-etched. The etching rate of the Poly-Si film was 600.0 nm/min or more, the etching rate of the SiN film was 600.0 nm/min or more, and the etching rate of the SiO$_2$ film was 24.2 nm/min. The selectivity of Poly-Si relative to SiN is unknown, and the selectivity of Poly-Si relative to SiO$_2$ is 24.8 or more.

The etching rate and selectivity of each Example and Comparative Example are shown in Table 1.

TABLE 1

| | XF | XF flow rate [sccm] | NO flow rate [sccm] | N$_2$ flow rate [sccm] | Temperature [° C.] | Etching rate [nm/min] | Poly-Si selectivity |
|---|---|---|---|---|---|---|---|
| Ex. 1 | ClF | 100 | 100 | 400 | 100 | Poly-Si: > 600.0<br>SiN: 1.5<br>SiO$_2$: 0.0 | /SiN: > 400.0<br>/SiO$_2$: ∞ |
| Ex. 2 | ClF | 100 | 100 | 400 | 200 | Poly-Si: > 600.0<br>SiN: 1.7<br>SiO$_2$: 0.0 | /SiN: > 352.9<br>/SiO$_2$: ∞ |

TABLE 1-continued

| | XF | XF flow rate [sccm] | NO flow rate [sccm] | N$_2$ flow rate [sccm] | Temperature [° C.] | Etching rate [nm/min] | Poly-Si selectivity |
|---|---|---|---|---|---|---|---|
| Ex. 3 | ClF | 100 | 100 | 400 | 300 | Poly-Si: > 600.0<br>SiN: 1.2<br>SiO$_2$: 12.9 | /SiN: > 500.0<br>/SiO2 > 46.5 |
| Ex. 4 | ClF | 100 | 100 | 400 | 400 | Poly-Si: > 600.0<br>SiN: 24.9<br>SiO$_2$: 0.0 | /SiN: > 24.1<br>/SiO$_2$: ∞ |
| Comp. Ex. 1 | ClF | 100 | 0 | 400 | 100 | Poly-Si: 2.0<br>SiN: 1.2<br>SiO$_2$: 0.0 | /SiN: 1.7<br>/SiO$_2$: ∞ |
| Comp. Ex. 2 | ClF | 100 | 0 | 400 | 200 | Poly-Si: 170.8<br>SiN: 3.3<br>SiO$_2$: 0.0 | /SiN: 51.8<br>/SiO$_2$: ∞ |
| Comp. Ex. 3 | ClF | 100 | 0 | 400 | 300 | Poly-Si: 375.4<br>SiN: 12.5<br>SiO$_2$: 4.0 | /SiN: 30.0<br>/SiO$_2$: 93.9 |
| Comp. Ex. 4 | ClF | 100 | 0 | 400 | 400 | Poly-Si: > 600.0<br>SiN: 141.7<br>SiO$_2$: 0.0 | /SiN: > 4.2<br>/SiO$_2$: ∞ |
| Ex. 5 | ClF | 100 | 300 | 400 | 200 | Poly-Si: 501.4<br>SiN: 2.1<br>SiO$_2$: 0.0 | /SiN: 238.8<br>/SiO$_2$: ∞ |
| Ex. 6 | ClF | 100 | 100 | 400 | 20 | Poly-Si: 29.4<br>SiN: 0.4<br>SiO$_2$: 0.0 | /SiN: 73.5<br>/SiO$_2$: ∞ |
| Comp. Ex. 5 | F$_2$ | 100 | 100 | 400 | 200 | Poly-Si: > 600.0<br>SiN: > 600.0<br>SiO$_2$: 24.2 | /SiN: —<br>/SiO$_2$: > 24.8 |

Examples 1 to 4 reveal that the method of the present invention is excellent in selectivity of Poly-Si to SiN and in selectivity of Poly-Si to SiO$_2$ at a temperature of 700° C. or lower. In particular, the selectivity of Poly-Si to SiN is found to be stable at a temperature of 100° C. to 300° C.

In comparison between Examples 1 to 4 and Comparative Examples 1 to 4, it is found that in the absence of NO, the etching rate of Poly-Si decreases at all the temperatures as well as the etching rate of Poly-Si is unstable while varying with temperature. As described above, this is because when the ratio of NO is low, excessive reactions progress due to ClF, thereby making controlled reactions difficult.

As in Example 5, when the flow rate of NO is large, the etching rate of Poly-Si decreases, but the etching rate of SiN does not vary considerably. Consequently, the selectivity of Poly-Si to SiN decreases. As described above, this is because when the ratio of NO is high, the concentration of Cl atoms is diluted or ClNO, which is not quite active in reactions, is generated, thereby decreasing etching and cleaning efficiency.

Example 6 reveals that the method of the present invention can be performed even at room temperature of 20° C. while achieving a satisfactorily practical level of the selectivity of Poly-Si to SiN or the selectivity of Poly-Si to SiO$_2$.

In comparison between Example 2 and Comparative Example 5, it is found that when F$_2$ is used in place of ClF, not only the etching rate of Poly-Si, but also the etching rate of SiN increases, thereby decreasing the selectivity of Poly-Si to SiN.

As in the foregoing, the method of the present invention are excellent in both selectivity of Poly-Si to SiN as well as selectivity of Poly-Si to SiO$_2$. In addition, these selectivities are temperature-independent and thus stable in a temperature range of 700° C. or lower. The method of the present invention is found to be particularly excellent in selectivity of Poly-Si to SiN compared with a case in which conventional ClF alone is used as an etchant (Comparative Examples 1 to 4) or a case in which a combination of F$_2$ and NO is used (Comparative Example 5).

The invention claimed is:

1. A dry cleaning method comprising:
simultaneously introducing gases consisting of a monofluoro interhalogen gas represented by XF, where X is a halogen element selected from the group consisting of Cl, Br and I, and nitric oxide (NO), and optionally an inert gas as a diluent gas, into a reaction chamber of a film forming apparatus; and thermally inducing a reaction of an object to be removed for cleaning with XF and NO to remove the object, wherein, during dry cleaning, a temperature inside the reaction chamber of the film forming apparatus or a temperature of the object to be cleaned is 100° C. to 400° C., and a film consisting of Si is selectively removed.

2. The dry cleaning method according to claim 1, wherein when a mixing ratio of the monofluoro interhalogen gas represented by XF to nitric oxide (NO) is expressed in a volume ratio or a flow rate ratio as XF:NO=1:Y, Y satisfies 0<Y<2.

3. The dry cleaning method according to claim 1, wherein the monofluoro halogen gas is ClF.

4. The dry cleaning method according to claim 1, wherein a chemical reaction of the following equation 1 is induced by a heating temperature of 100° C. to 400° C. for a mixture of the monofluoro interhalogen gas represented by XF and nitric oxide (NO), $$XF + NO \rightarrow X + FNO \qquad (1)$$

and generated X atoms, where X is a halogen element consisting of Cl, Br and I, and nitrosyl fluoride (FNO) are supplied.

5. The dry cleaning method according to claim 1, wherein, during dry cleaning, the temperature inside the reaction chamber of the film forming apparatus or the temperature of the object to be cleaned is 100° C. to 300° C.

6. The dry cleaning method according to claim 1, wherein by diluting XF and nitric oxide (NO) with at least one inert gas selected from the group consisting of $N_2$, Ar, He, Kr, and Xe, cleaning rate and/or cleaning selectivity are controlled and/or corrosion of or damage to the interior of the film forming apparatus are decreased in dry cleaning.

7. A dry cleaning method comprising: mixing gases consisting of a monofluoro interhalogen gas represented by XF, where X is a halogen element selected from the group consisting of Cl, Br and I, and nitric oxide (NO), and optionally an inert gas as a diluent gas, followed by heating to a temperature to induce a chemical reaction between XF and NO; and supplying a generated excited species to the inside of a film forming apparatus, wherein the heating temperature for a mixture of the monofluoro interhalogen gas represented by XF and nitric oxide (NO) is 100° C. to 400° C. and a film consisting of Si is selectively removed.

8. The dry cleaning method according to claim 7, wherein when a mixing ratio of the monofluoro interhalogen gas represented by XF to nitric oxide (NO) is expressed in a volume ratio or a flow rate ratio as XF:NO=1:Y, Y satisfies 0<Y<2.

9. The dry cleaning method according to claim 7, wherein a monofluoro halogen gas is ClF.

10. The dry cleaning method according to claim 7, wherein a chemical reaction of the following equation 1 is induced by a heating temperature of 100° C. to 400° C. for a mixture of the monofluoro interhalogen gas represented by XF and nitric oxide (NO), $$XF+NO \rightarrow X+FNO \qquad (1)$$

and generated X atoms, where X is a halogen element consisting of Cl, Br and I, and nitrosyl fluoride (FNO) are supplied.

11. The dry cleaning method according to claim 7, wherein the heating temperature for the mixture of the monofluoro interhalogen gas represented by XF and nitric oxide (NO) is 100° C. to 300° C.

12. The dry cleaning method according to claim 7, wherein by diluting XF and nitric oxide (NO) with at least one inert gas selected from the group consisting of $N_2$, Ar, He, Kr, and Xe, cleaning rate and/or cleaning selectivity are controlled and/or corrosion of or damage to the interior of the film forming apparatus are decreased in dry cleaning.

* * * * *